(12) United States Patent
Vacanti et al.

(10) Patent No.: US 7,668,505 B2
(45) Date of Patent: Feb. 23, 2010

(54) RADIO HAVING A MEMS PRESELECT FILTER

(75) Inventors: David C. Vacanti, Renton, WA (US);
Ijaz H. Jafri, Woodinville, WA (US);
Keith A. Bayern, Lake Forest Park, WA (US)

(73) Assignee: Honeywell International Inc., Morristown, NJ (US)

( * ) Notice: Subject to any disclaimer, the term of this patent is extended or adjusted under 35 U.S.C. 154(b) by 570 days.

(21) Appl. No.: 10/938,482

(22) Filed: Sep. 10, 2004

(65) Prior Publication Data

US 2006/0057959 A1    Mar. 16, 2006

(51) Int. Cl.
*H04B 7/14* (2006.01)

(52) U.S. Cl. .......... 455/20; 455/118; 455/307; 455/339; 375/350

(58) Field of Classification Search ........ 455/339, 455/334, 307
See application file for complete search history.

(56) References Cited

U.S. PATENT DOCUMENTS

| | | | |
|---|---|---|---|
| 6,680,600 B2 | 1/2004 | Emori et al. | |
| 6,680,660 B2 | 1/2004 | Nguyen | |
| 7,187,735 B2 * | 3/2007 | Kent et al. | 375/350 |
| 2003/0027534 A1 * | 2/2003 | Swazey | 455/118 |
| 2004/0092243 A1 * | 5/2004 | Hey-Shipton | 455/307 |
| 2004/0131131 A1 * | 7/2004 | Peach et al. | 375/316 |

OTHER PUBLICATIONS

Elliott R. Brown. RF-MEMS Switches for Reconfigurable Integrated Circuits, IEEE Transactions on Microwave Theory and Techniques, vol. 46, No. 11, Nov. 1, 1998, pp. 1868-1880.
Ratazzi E P Ed, Institute of electrical and Electronics Engineers, Microeletromechanical Devices for Multimode Communication Systems, IEEE 2000 National Aerospace and Electronics Conference., Dayton, OH, Oct. 10-12, 2000, vol. CONF. 51, pp. 346-353.

* cited by examiner

*Primary Examiner*—Yuwen Pan
*Assistant Examiner*—Ajibola Akinyemi
(74) *Attorney, Agent, or Firm*—Fogg & Powers LLC

(57) ABSTRACT

The present invention provides systems and methods for pre-filter in a VHF receiver using Micro-Electro-Mechanical Systems (MEMS) filters. The system includes an antenna, and first and second Micro-Electro-Mechanical Systems (MEMS) filters. The first MEMS filter filters a signal received by the antenna based on a first pre-defined bandwidth, and the second MEMS filter filters the signal filtered by the first MEMS filter based on a second bandwidth. The system also includes an analog to digital converter that converts the signal filtered by the second MEMS filter into a digital signal, a down converter that down converts the digital signal produced by the A to D converter, and a digital signal processor that processes the down converted digital signal produced by the down converter. The first and second MEMS filters or the down converter are adjustable based on a received tuning signal.

19 Claims, 9 Drawing Sheets

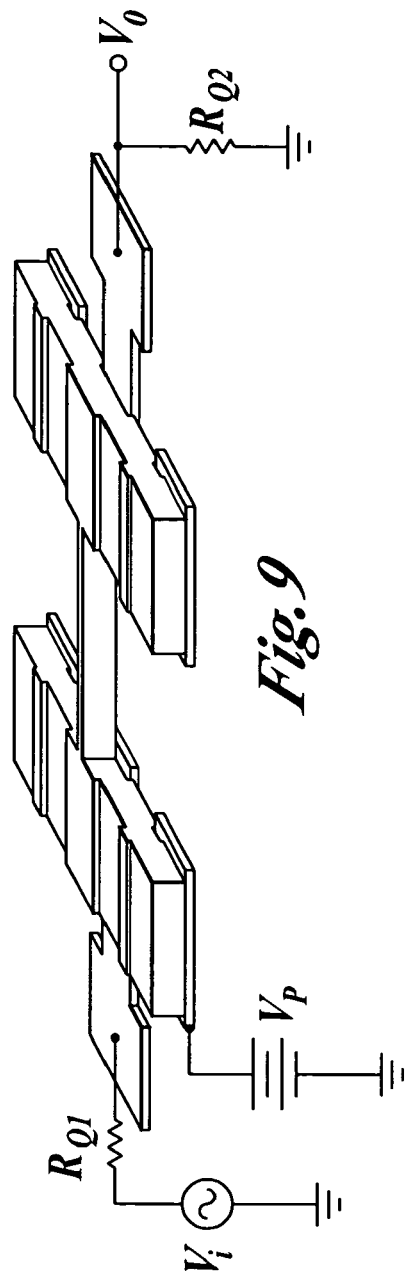
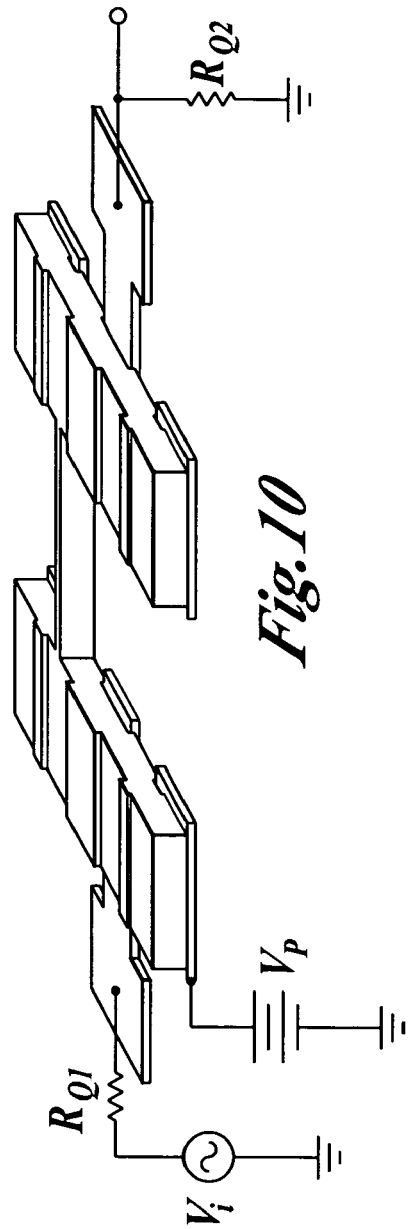
Fig.9
Fig.10

RADIO HAVING A MEMS PRESELECT FILTER

FIELD OF THE INVENTION

This invention relates to radios, and more particularly, to pre-filters used in radios.

BACKGROUND OF THE INVENTION

The need for passive off-chip components has long been a key barrier against communication transceiver miniaturization. In particular, the majority of the high-Q bandpass filters commonly used in the RF and IF stages of heterodyning transceivers are realized using off-chip, mechanically-resonant components, such as crystal and ceramic filters and SAW devices. Due to higher quality factor Q, such technologies greatly outperform comparable filters implemented using transistor technologies, in insertion loss, percent bandwidth, and achievable rejection. High Q is further required to implement local oscillators or synchronizing clocks in transceivers, both of which must satisfy strict phase noise specifications. Off-chip elements (e.g., quartz crystals) are utilized for this purpose.

Being off-chip components, the above mechanical devices must interface with integrated electronics at the board level, and this constitutes an important bottleneck against the miniaturization of super-heterodyne transceivers. For this reason, recent attempts to achieve single-chip transceivers for paging and cellular communications have utilized alternative architectures that attempt to eliminate the need for off-chip high-Q components via higher levels of transistor integration. Unfortunately, without adequate front-end selectivity, such approaches have suffered somewhat in overall performance, to the point where they so far are usable only in less demanding applications.

Given this, and recognizing that future communication needs will most likely require higher levels of performance, single-chip transceiver solutions that retain high-Q components and that preserve super-heterodyne-like architectures are desirable.

Although mechanical circuits, such as quartz crystal resonators and SAW filters, provide essential functions in the majority of transceiver designs, their numbers are generally suppressed due to their large size and finite cost. Unfortunately, when minimizing the use of high-Q components, designers often trade power for selectivity (i.e., Q), and hence, sacrifice transceiver performance. As a simple illustration, if the high-Q IF filter in the receive path of a communication subsystem is removed, the dynamic range requirement on the subsequent IF amplifier, IQ mixer, and A/D converter circuits, increases dramatically, forcing a corresponding increase in power consumption. Similar trade-offs exist at RF, where the larger the number or greater the complexity of high-Q components used, the smaller the power consumption in surrounding transistor circuits.

Micro-Electro-Mechanical Systems (MEMS) are presently being considered for use in receivers. For example, as shown in FIG. 1, U.S. Pat. No. 6,680,660 to Nguyen presents using MEMS filters to perform channel selection in a conventional heterodyne conversion receiver. Nguyen fails to simplify the design of a heterodyne based VHF receiver and thus fails to provide significant improvement.

Therefore, there exists a need for a narrow band MEMS pre-filter in a VHF receiver that results in lower production costs, increased reliability, reduced weight, reduced power dissipation, and higher signal to noise ratio.

SUMMARY OF THE INVENTION

The present invention provides systems and methods for pre-filter in a VHF receiver using Micro-Electro-Mechanical Systems (MEMS) filters, thereby, lowering production costs, increasing reliability, and reducing weight and dissipation without decreasing the signal-to-noise ratio.

The system includes an antenna and a pre-select filter in signal communication with the antenna. The pre-select filter includes a first Micro-Electro-Mechanical Systems (MEMS) filter and a second MEMS filter in signal communication with the first MEMS filter. The first MEMS filter filters a signal received by the antenna based on a first pre-defined bandwidth, and the second MEMS filter filters the signal filtered by the first MEMS filter based on a second bandwidth. The system also includes an analog to digital converter that converts the signal filtered by the second MEMS filter into a digital signal, a down converter down converts the digital signal produced by the A to D converter, and a digital signal processor that processes the down converted digital signal produced by the down converter.

In accordance with other aspects of the invention, the first and second MEMS filters or the down converter are adjustable based on a received tuning signal. The tuning signal includes a tuning voltage.

In accordance with still further aspects of the invention, the filtered frequencies of the first MEMS filter is offset from the filtered frequencies of the second MEMS filter by a pre-defined amount. In one embodiment, the offset is between 230-270 khz and the bandwidth of the MEMS filters are between 0.9 MHz and 2.1 MHz.

BRIEF DESCRIPTION OF THE DRAWINGS

The preferred and alternative embodiments of the present invention are described in detail below with reference to the following drawings.

FIGS. 8-12 illustrate perspective views of an example MEMS filters used as the filter in any of the embodiments of the present invention.

DETAILED DESCRIPTION OF THE INVENTION

Figure 1:
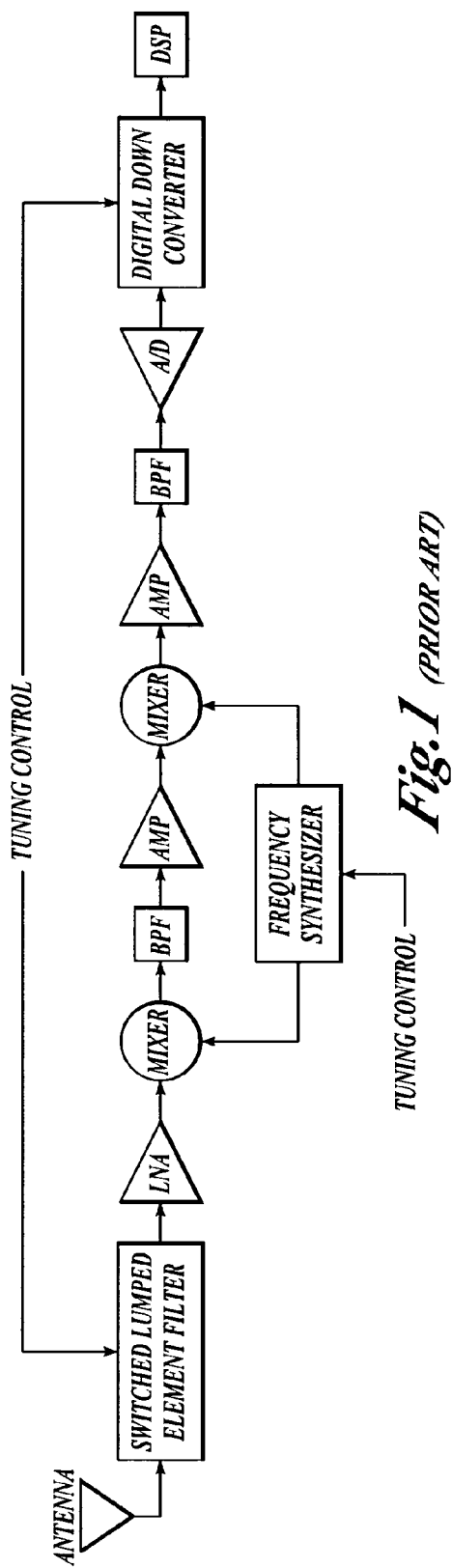
FIG. 1 illustrates components of a prior art radio.
Figure 2:
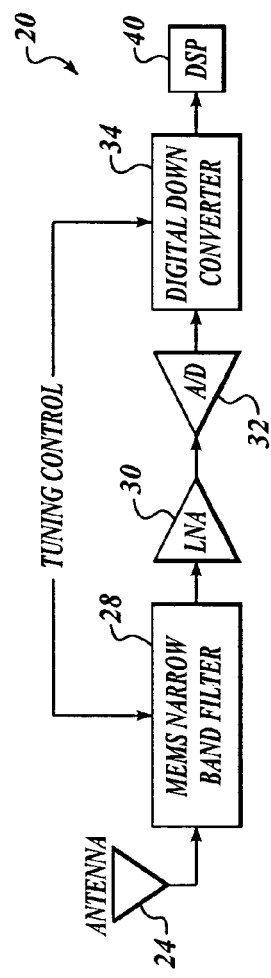
FIG. 2 illustrates components of a radio formed in accordance with an embodiment of the present invention.

FIG. 2 illustrates a radio receiver system 20 formed in accordance with an embodiment of the present invention. The receiver system 20 includes an antenna 24, a Micro-Electro-Mechanical Systems (MEMS) filter component 28, an amplifier 30, an analog to digital (A/D) converter 32, a digital down converter 34, and a digital signal processor (DSP) 40. The MEMS filter component 28 acts to pre-filter the signals received by the antenna 24. The signals filtered by the MEMS filter component 28 are amplified by the amplifier 30, such as a low noise amplifier (LNA). The amplified signals are converted to digital format by the A/D converter 32 and sent to the digital down converter 34. The digital down converter 34 isolates the digital signal to allow the DSP 40 to properly process the desired channel of the original signal received by the antenna 24.

In one embodiment, the MEMS filter component 28 and the digital down converter 34 are adjusted by a received a tuning control signal from a tuning controller (not shown).

Figure 3:
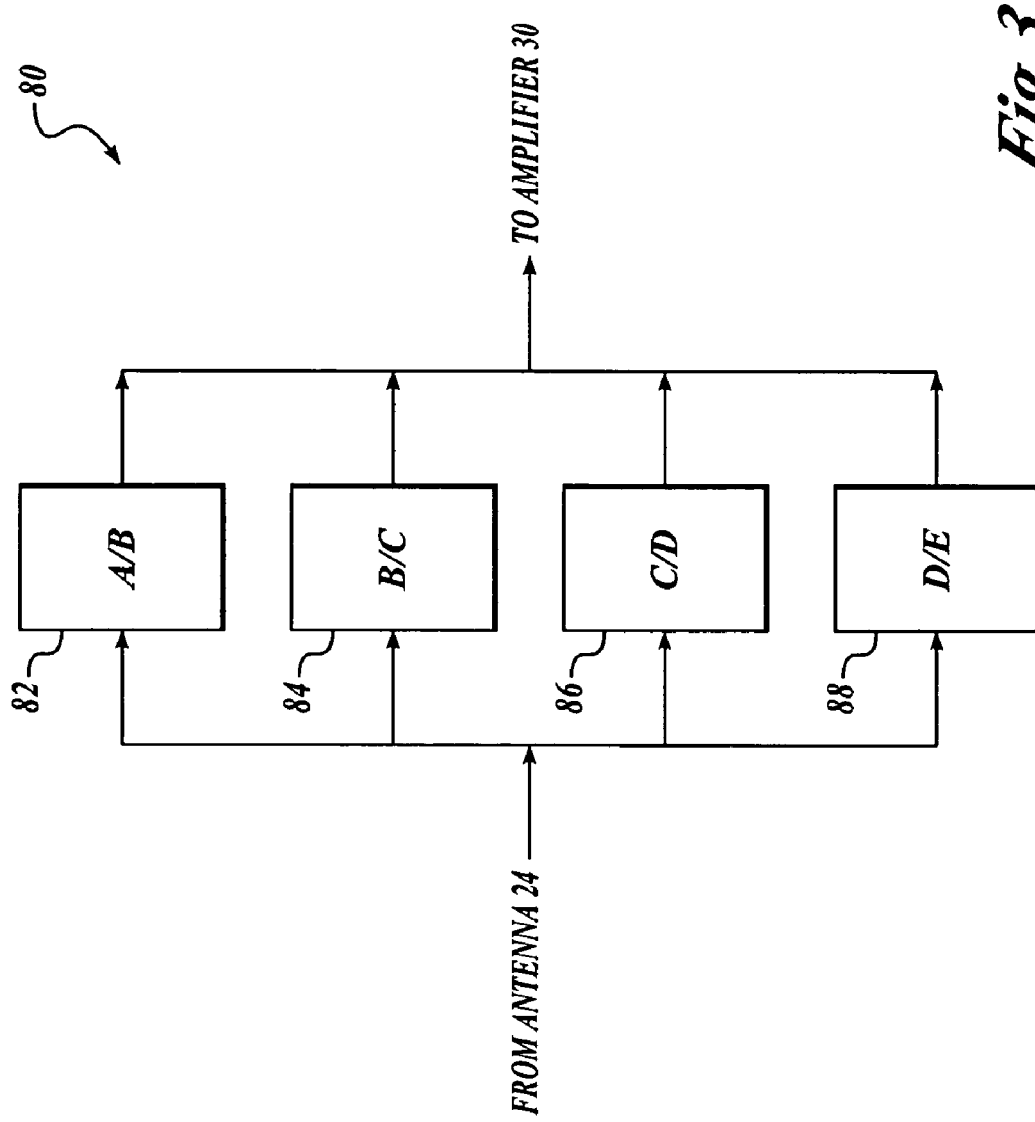
FIGS. 3 and 4 illustrate a radio configuration as formed in accordance with an embodiment of the present invention.

FIGS. 3-6 illustrate a first embodiment of the MEMS filter component 28. As shown in FIG. 3, a system 80 pre-filters the analog radio signals received from the antenna 24. The system 80 includes four separate switchable banks of MEMS filters 82-88. Each of the banks of filters 82-88 are controlled by a common switch signal. The common switch signal is based on or is associated with the tuning control signal received from the tuning controller. The filter banks 82-88 allow selection of a channel of the signal received from the antenna 24. Components of the filter banks 82-88 are described in FIGS. 4 and 5 below.

Figure 4:
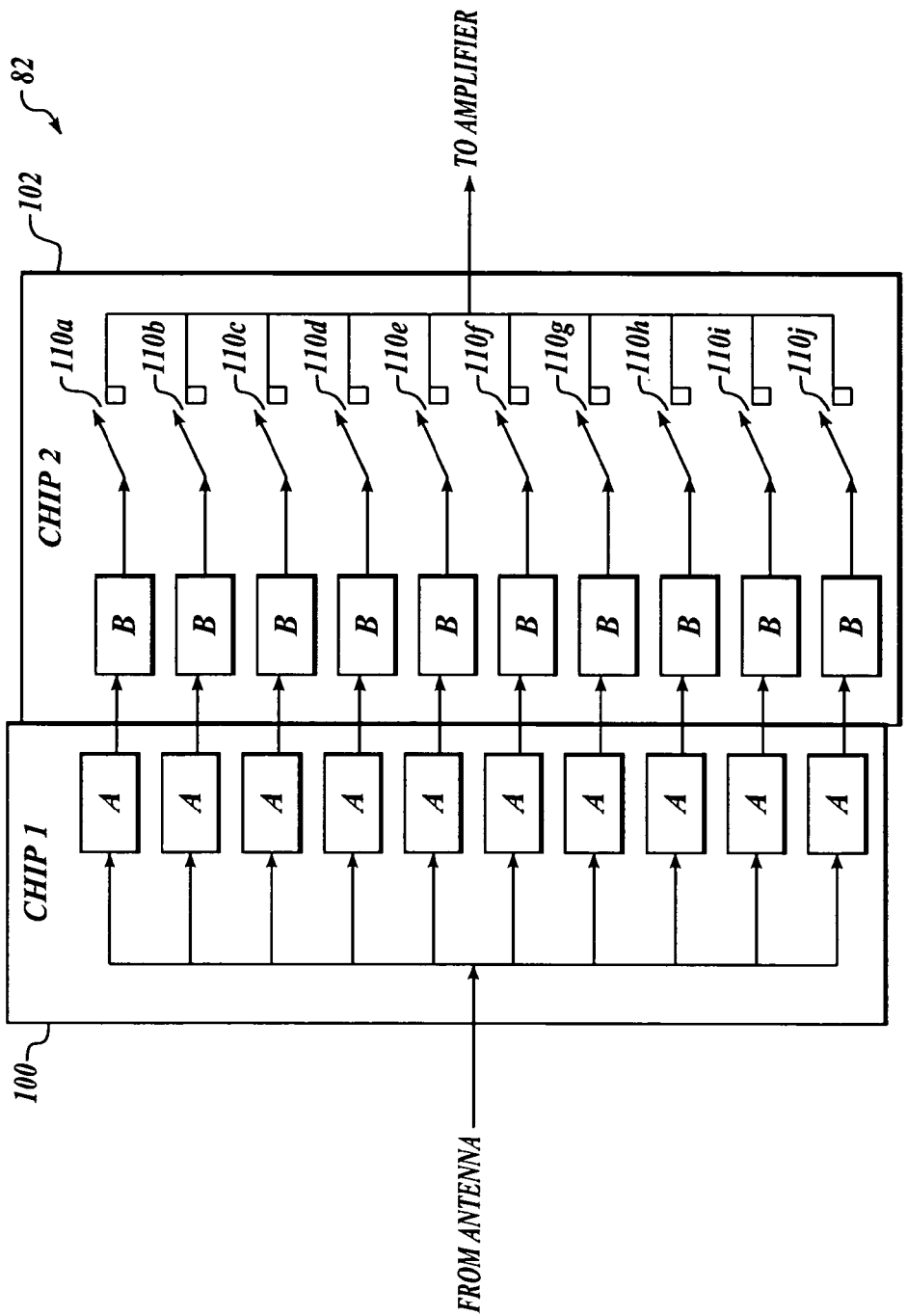
Figure 6:
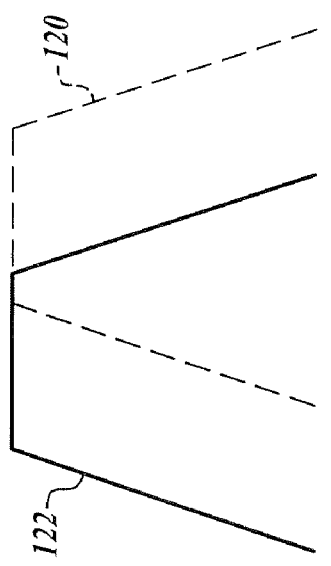
FIG. 6 illustrates the filtering performed by two filters of the system shown in FIG. 2.

FIG. 4 illustrates the first filter bank 82 having two groups of MEMS filters 100 and 102. The first filter group 100 includes a set of MEMS filters A and the second group 102 includes a set of MEMS filters B. In this embodiment, the first filter group 100 includes ten MEMS filters A. By way of example, the component 80 shown in FIG. 3 filters radio signals between the 108 to 118 MHz bandwidth. Each of the MEMS filters A are configured to filter a 1 MHz wide bandwidth. Each of the filters A are offset by 1 MHz from a successive or adjacent filter A. Row 150 of FIG. 6 illustrates the overlapping filtering performed by the filters A.

The second group of filters 102 also includes ten MEMS filters B. The MEMS filters B are similar to the MEMS filters A in that they are 1 MHz wide and offset from each other by 1 MHz. However, the MEMS filters B are offset from the MEMS filters A by 250 kHz. Each of the ten filters B are coupled to corresponding MEMS filters A for receiving the 1 MHz channel produced by the corresponding MEMS filter A. The output of each of the MEMS filters B is a signal filtered to 250 kHz (channel bandwidth 250 kHz). FIG. 6 illustrates the filtering performed by the filters B.

Figure 5:
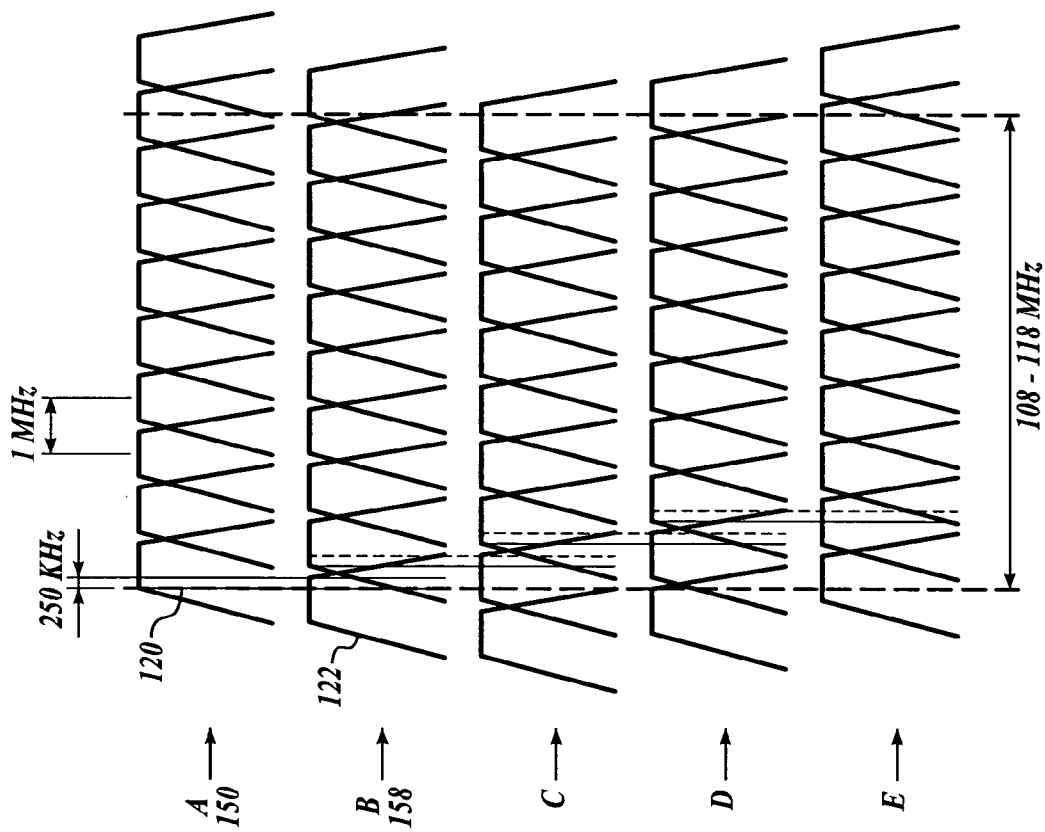
FIG. 5 illustrates an example spectrum of the filtering performed by system shown in FIGS. 3 and 4.

Attached to each of the MEMS filters B are switches 110a-j. The switches 110a-j are controlled by the switch signal received by the component 82. So, for example, if the tuning control signal (switch signal) identifies that the first channel of the 108 to 118 MHz frequency band is to be selected, the first switch 110a of the component 82 closes to complete the circuit between the corresponding first MEMS filters A and B, thus producing the first two filters 120 and 122 as shown in FIGS. 5 and 6 and selecting the first 250 khz channel.

In another embodiment, switches 110a-j are not included, because the voltage value across respective output resistors acts as a switch. When no voltage is applied for tuning, there is no current at the resistor.

Because only the first quarter of all the channels can be filtered by the filter bank 82, the other filter banks 84-88 are included. Thus, the second filter bank 84 filters the second quarter of all the channels and includes a third set of ten filters C coupled to the second set of filters B. The third filter bank 86 filters the third quarter of all the channels and includes the third set of MEMS filters C coupled to a fourth set of MEMS filters D. The fourth bank 88 filters the last quarter of all the channels and includes the fourth set of MEMS filters D coupled to a fifth set of MEMS filters E. The second, third, and fourth filter banks 84-88 also include addressable switches coupled to each of the pairs of MEMS filters, similar to switches 110a-j.

In one embodiment, the switches in each of the banks 82-88 are MEMS switches. Each of the set of MEMS filters A-E are deposited on separate chips. The multiple MEMS chips along with other control circuitry are assembled into a single multi-chip module. The multi-chip module is hermetically packaged into a container. The multi-chip module can be designed to be surface mounted onto a circuit board and is approximately 1-inch by 1-inch or less in size. Each MEMS filter is approximately 30 microns by 30 microns in size.

Figure 7:
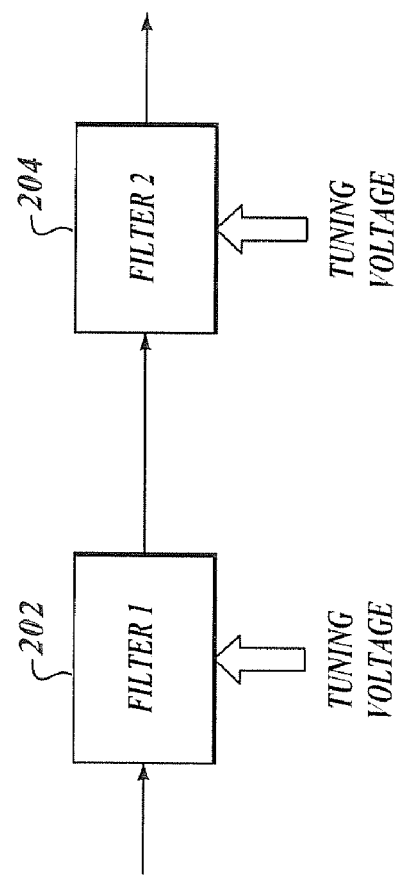
FIG. 7 illustrates an alternate embodiment of the present invention.

FIG. 7 illustrates an alternate embodiment for the MEMS filter component 28 shown in FIG. 2. In this embodiment, only two MEMS filters 202 and 204 are necessary for performing the filtering performed by the filter component 28. Each of the filters 202 and 204 received a tuning voltage signal that is separate from or included within the tuning control signal. The tuning voltage signal pre-loads a mechanical actuator component of the MEMS filters 202 and 204 with a voltage in order to alter the frequencies that the MEMS filters 202 and 204 filter. In one embodiment, the tuning voltage is selected in order for each filter 202 and 204 to overlap by a pre-defined bandwidth. For example, each of the filters 202 and 204 filter a 2 MHz bandwidth and the overlap between the two is approximately 250 khz. The results of the two filters 202 and 204 produces an approximate 8:1 reduction in the bandwidth of the received signal of just one of the filters 202 and 204. The filtering looks similar to that shown in FIG. 6. Because the filters 202 and 204 are tunable, they can be adjusted by the tuning voltage in order to select the desired channel or channel within a bandwidth.

Figure 8:
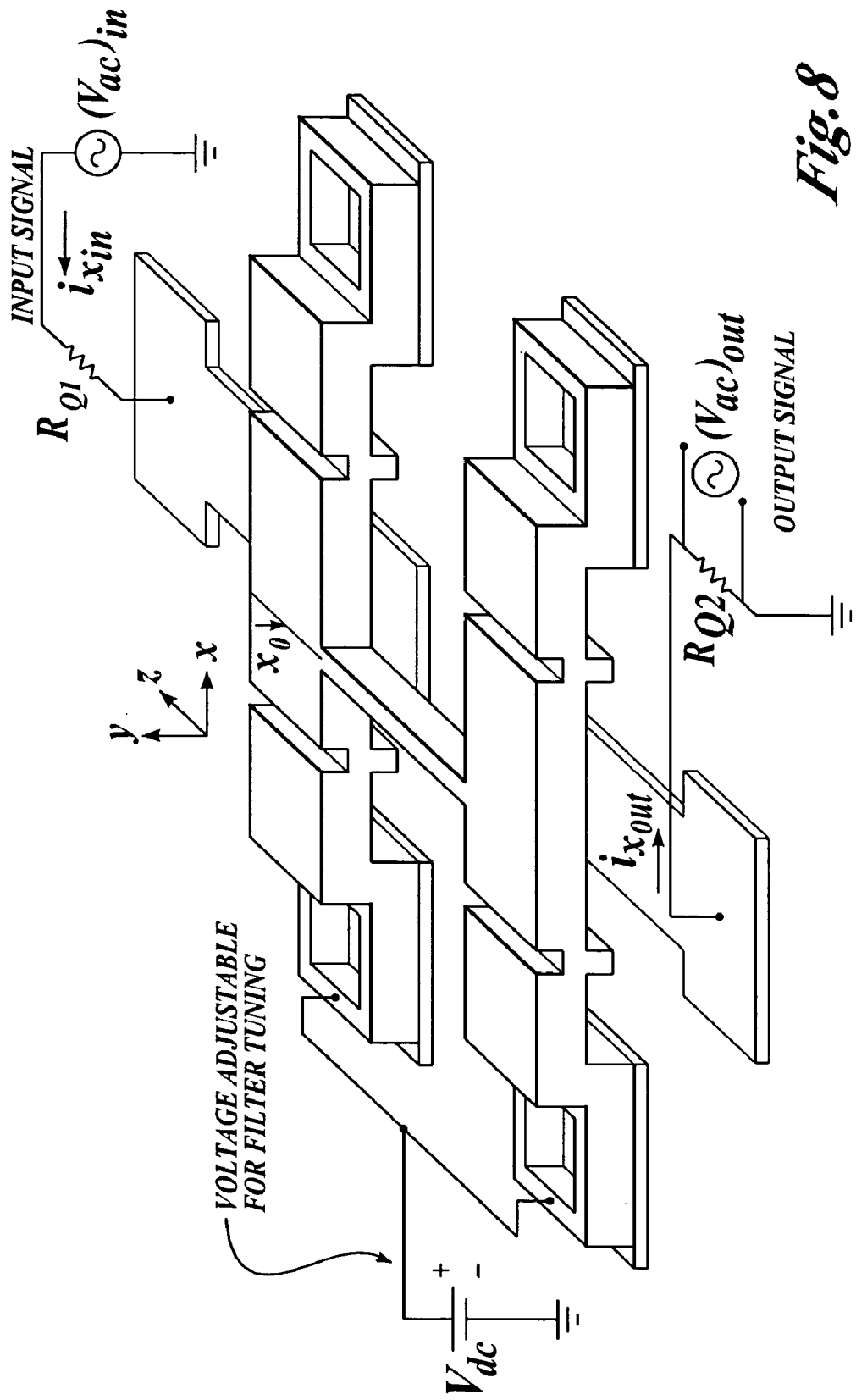

FIGS. 8, 9, and 10 illustrate various embodiments of MEMS filters used in the embodiments shown in FIGS. 3, 4, and 7. In FIG. 8, $V_{dc}$ is the tunable voltage input and in FIGS. 9 and 10, VP is the tunable voltage for those MEMS filters.

Figure 11:
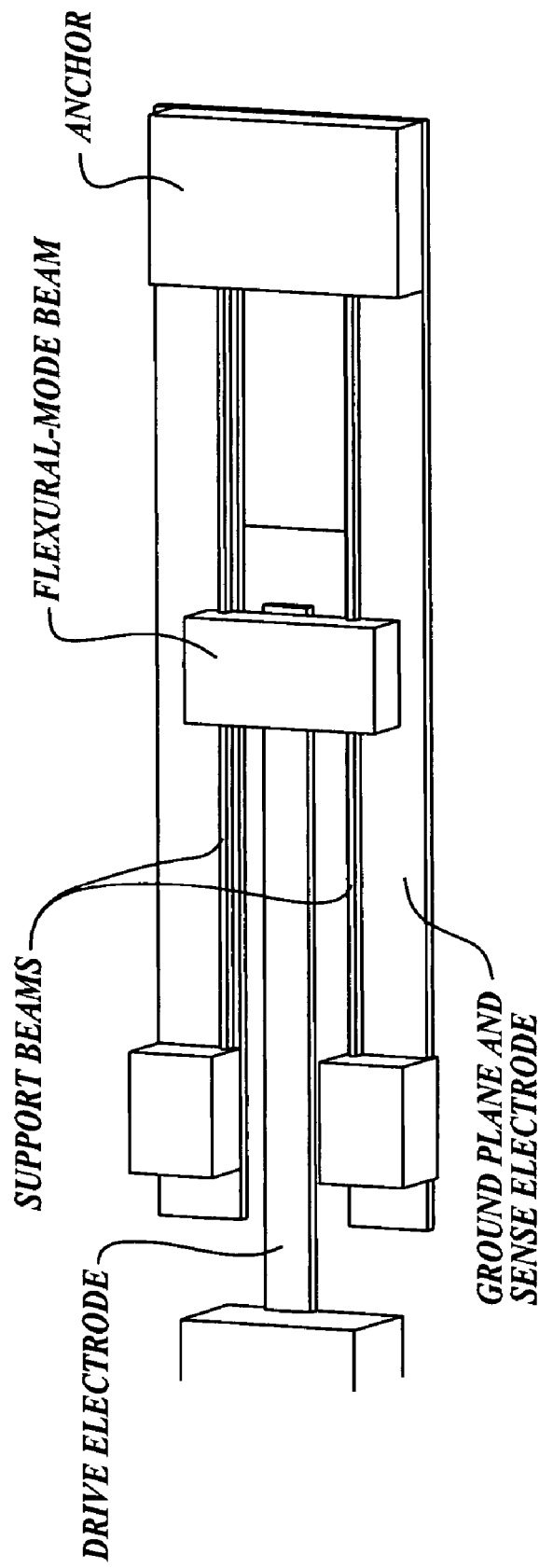

FIG. 11 illustrates a MEMS filter with a beam with free-free ends, in which additional mechanical circuit complexity is added to allow free-free operation, and to reduce anchor losses to the substrate. Via proper support beam design, anchor losses can be greatly attenuated in this structure, and Q's on the order of 8,000 are attained even at 92 MHz. Even higher frequencies should be attainable by either scaling the dimensions of the device, or by using a higher mode of resonance.

Figure 12:
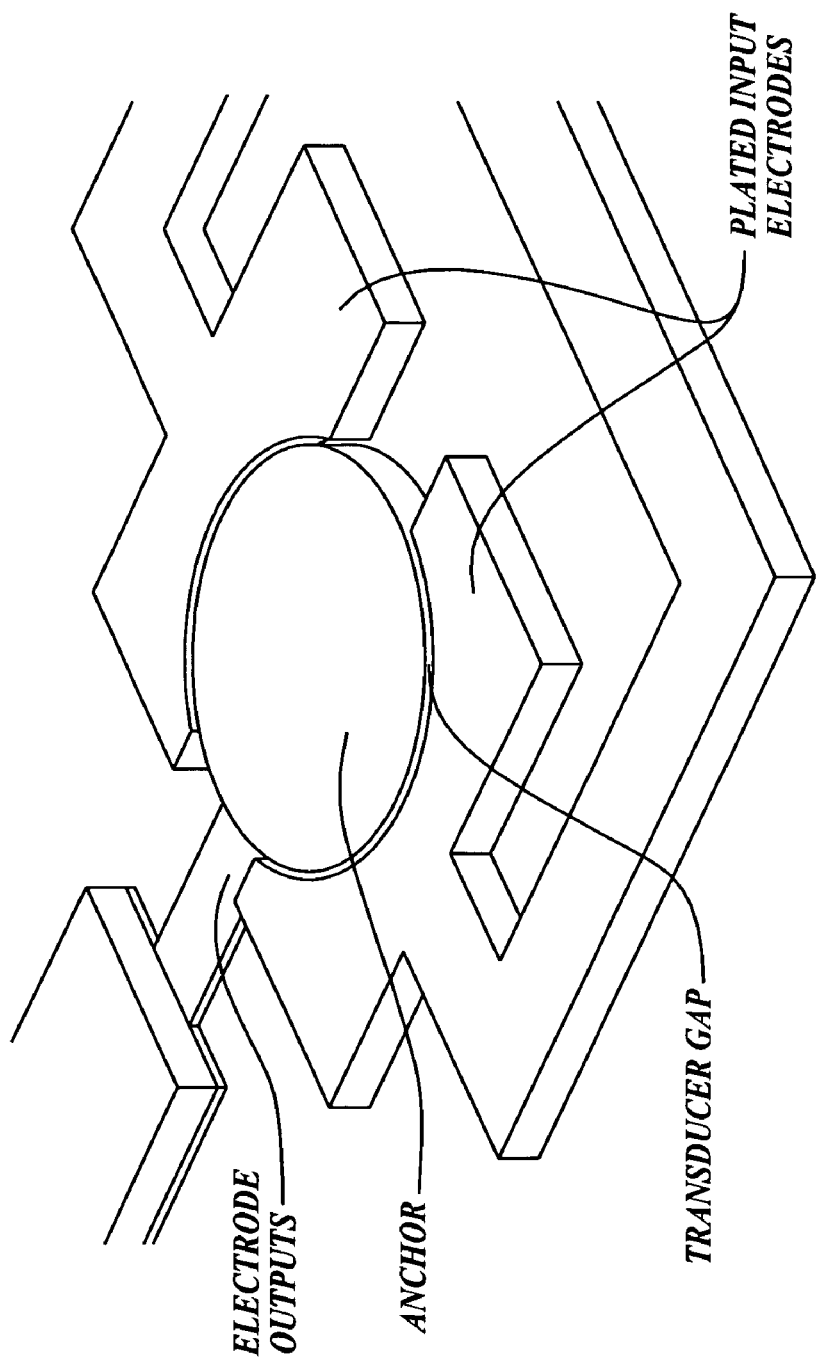

FIG. 12 illustrates a µmechanical disk resonator for suppressing the scaling-induced performance limitations. The mechanical disk resonator uses a radial contour (rather than flexural) mode of vibration to attain a mid-VHF frequency of 156 MHz with a Q of 9,400, while still retaining relatively large dimensions. The resonator includes a polysilicon disk suspended by a stem located at its center and enclosed by metal electrodes spaced from the disk perimeter. Such tiny lateral electrode-to-resonator gaps are achieved using a lateral sub-µm gap process technology that combines surface-micromachining and metal-electroplating technologies with a sacrificial sidewall technique to achieve sub-µm lateral gaps without the need for aggressive lithography or etching.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A system comprising:
   an antenna; and
   a pre-select filter in signal communication with the antenna, the pre-select filter comprising:
   a plurality of subfilters configured to filter a received signal, each subfilter comprising:

a first Micro-Electro-Mechanical Systems (MEMS) filter set comprising a first plurality of MEMS filters in parallel with each other and configured to filter the received signal at a first bandwidth; and a second MEMS filter set comprising a second plurality of MEMS filters in parallel with each other and configured to filter the signal filtered by the first MEMS filter set at a second bandwidth that is offset from the first bandwidth;

wherein the plurality of MEMS filters in the second MEMS filter set are each directly coupled in series to a corresponding one of the plurality of MEMS filters in the first MEMS filter set in a one-to-one coupling relationship; and a switch coupled to each of the second plurality of MEMS filters, wherein the switch is activated based on a tuning signal received by the pre-select filter;

an amplifier in signal communication with the pre-select filter; and an analog-to-digital converter in signal communication with and directly connected to the amplifier.

2. The system of the claim 1, wherein the tuning signal includes a tuning voltage.

3. The system of claim 1, wherein each subfilter filters a predefined channel.

4. The system of claim 3, wherein the channel has a bandwidth between 230-270 kHz and the bandwidth of the MEMS filters are between 0.9 MHz and 2.1 MHz.

5. The system of claim 1, wherein the analog-to-digital converter is configured to convert the signal filtered by the plurality of subfilters into a digital signal.

6. The system of claim 5, further comprising a down converter for down converting the digital signal produced by the analog-to-digital converter.

7. The system of claim 6, further comprising a digital signal processor for processing the down converted digital signal produced by the down converter.

8. The system of claim 7, further comprising a tuning controller for controlling the switch.

9. A method comprising:
receiving a radio signal at an antenna;
generating a first signal by filtering the radio signal received by the antenna using a first Micro-Electro-Mechanical Systems (MEMS) filter set comprising a first plurality of MEMS filters in parallel with each other and configured to filter the received radio signal at a first bandwidth; and
generating a second signal by filtering the first signal using a second MEMS filter set comprising a second plurality of MEMS filters in parallel with each other and configured to filter the radio signal filtered by the first MEMS filter set at a second bandwidth that is offset from the first bandwidth, the plurality of MEMS filters in the second MEMS filter set each directly coupled in series to a corresponding one of the plurality of MEMS filters in the first MEMS filter set in a one-to-one coupling relationship;
directing the second signal to an amplifier in signal communication with the second MEMS filter set to amplify the second signal; and
directing the amplified second signal to an analog-to-digital converter in signal communication with and directly connected to the amplifier.

10. The method of claim 9, further comprising:
converting the amplified second signal into a digital signal;
down converting the digital signal; and
processing the down converted signal at a digital signal processor.

11. The method of claim 9, further comprising:
receiving a tuning signal; and
selecting a second signal produced by one of the plurality of MEMS filters in the second MEMS filter set based on the received tuning signal.

12. The method of claim 11, wherein the tuning signal includes a tuning voltage.

13. The method of claim 9, wherein filtered frequencies of the plurality of MEMS filters in the first MEMS filter set are offset from filtered frequencies of the plurality of MEMS filters in the second MEMS filter set by a pre-defined amount.

14. The method of claim 13, wherein the offset is between 230-270 kHz and the bandwidth of the MEMS filters are between 0.9 MHz and 2.1 MHz.

15. A radio system comprising:
an antenna; and
at least one pre-select filter in signal communication with the antenna, the pre-select filter comprising:
a first filter group including a plurality of MEMS filters in parallel with each other and each configured to filter a bandwidth that is overlappingly offset from a bandwidth filtered by an adjacent MEMS filter in the first filter group;
a second filter group including a plurality of MEMS filters in parallel with each other and each configured to filter a bandwidth that is overlappingly offset from a bandwidth filtered by an adjacent MEMS filter in the second filter group, the plurality of MEMS filters in the second filter group each directly coupled in series to a corresponding one of the plurality of MEMS filters in the first filter group in a one-to-one coupling relationship, such that the bandwidth filtered by each of the MEMS filters in the second group is overlappingly offset from the bandwidth filtered by corresponding MEMS filters in the first group; and
a third filter group including a plurality of MEMS filters in parallel with each other and each configured to filter a bandwidth that is overlappingly offset from a bandwidth filtered by an adjacent MEMS filter in the third filter group, the plurality of MEMS filters in the third filter group each directly coupled in series to a corresponding one of the plurality of MEMS filters in the second filter group in a one-to-one coupling relationship, such that the bandwidth filtered by each of the MEMS filters in the third group is overlappingly offset from the bandwidth filtered by corresponding MEMS filters in the second group.

16. The system of claim 15, further comprising:
a fourth filter group including a plurality of MEMS filters in parallel with each other and each configured to filter a bandwidth that is overlappingly offset from a bandwidth filtered by an adjacent MEMS filter in the fourth filter group, the plurality of MEMS filters in the fourth filter group each directly coupled in series to a corresponding one of the plurality of MEMS filters in the third filter group in a one-to-one coupling relationship, such that the bandwidth filtered by each of the MEMS filters in the fourth group is overlappingly offset from the bandwidth filtered by corresponding MEMS filters in the third group; and
a fifth filter group including a plurality of MEMS filters in parallel with each other and each configured to filter a bandwidth that is overlappingly offset from a bandwidth filtered by an adjacent MEMS filter in the fifth filter group, the plurality of MEMS filters in the fifth filter group each directly coupled in series to a corresponding one of the plurality of MEMS filters in the fourth filter group in a one-to-one coupling relationship, such that the bandwidth filtered by each of the MEMS filters in the fifth group is overlappingly offset from the bandwidth filtered by corresponding MEMS filters in the fourth group.

17. A system comprising:
an antenna; and
a pre-select filter in signal communication with the antenna, the pre-select filter comprising:
  a first Micro-Electro-Mechanical Systems (MEMS) filter bank; and
  a second MEMS filter bank in signal communication and in series with the first MEMS filter;
  wherein the first MEMS filter bank is configured to filter a VHF signal received by the antenna based on a first bandwidth, and the second MEMS filter bank is configured to filter the signal filtered by the first MEMS filter bank based on a second bandwidth that is offset in center frequency from the first MEMS filter bank, such that multiple bandwidths within and narrower than the first and second bandwidths result when the signal passes through the first and second MEMS filter banks in series; and
  wherein the first and second MEMS filter banks each include resonant mechanical MEMS structures comprising one or more supported beams, one or more resonant disks, or combinations thereof.

18. The system of claim 17, further comprising an amplifier directly connected to the pre-select filter, and an analog-to-digital converter directly connected to the amplifier.

19. The system of claim 18, further comprising a digital down converter directly connected to the analog-to-digital converter, and a digital signal processor directly connected to the digital down converter.

* * * * *

UNITED STATES PATENT AND TRADEMARK OFFICE
CERTIFICATE OF CORRECTION

PATENT NO. : 7,668,505 B2  Page 1 of 1
APPLICATION NO. : 10/938482
DATED : February 23, 2010
INVENTOR(S) : Vacanti et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 731 days.

Signed and Sealed this

Seventh Day of December, 2010

David J. Kappos
*Director of the United States Patent and Trademark Office*